(12) United States Patent
Yu et al.

(10) Patent No.: US 11,823,915 B2
(45) Date of Patent: Nov. 21, 2023

(54) METHOD OF CLEANING AN APPARATUS THAT PROCESSES A SUBSTRATE

(71) Applicant: SEMES CO., LTD., Cheonan-si (KR)

(72) Inventors: Jintack Yu, Cheonan-si (KR); Jaemyoung Lee, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 15 days.

(21) Appl. No.: 16/952,629

(22) Filed: Nov. 19, 2020

(65) Prior Publication Data

US 2021/0074557 A1 Mar. 11, 2021

Related U.S. Application Data

(60) Continuation of application No. 15/671,848, filed on Aug. 8, 2017, now abandoned, which is a division of application No. 14/473,193, filed on Aug. 29, 2014, now abandoned.

(30) Foreign Application Priority Data

Aug. 30, 2013 (KR) .................... 10-2013-0104070
Dec. 27, 2013 (KR) .................... 10-2013-0165407

(51) Int. Cl.
*H01L 21/67* (2006.01)
*H01L 21/02* (2006.01)
*B08B 3/02* (2006.01)

(52) U.S. Cl.
CPC .......... *H01L 21/67051* (2013.01); *B08B 3/02* (2013.01); *H01L 21/02041* (2013.01); *H01L 21/02057* (2013.01)

(58) Field of Classification Search
CPC ................ B08B 3/02; H01L 21/02041; H01L 21/02057; H01L 21/67051
See application file for complete search history.

(56) References Cited

U.S. PATENT DOCUMENTS

| 6,012,858 | A | 1/2000 | Konishi | |
| 2001/0037858 | A1* | 11/2001 | Taniyama | H01L 21/67051 |
| | | | | 156/345.21 |
| 2003/0209523 | A1 | 11/2003 | Padhi et al. | |

(Continued)

FOREIGN PATENT DOCUMENTS

| CN | 101378006 A | 3/2009 |
| CN | 101901776 A | 12/2010 |

(Continued)

OTHER PUBLICATIONS

Machine translation of KR2013-0090213A (Year: 2013).*

(Continued)

*Primary Examiner* — Douglas Lee
(74) *Attorney, Agent, or Firm* — Harness, Dickey & Pierce, P.L.C.

(57) ABSTRACT

Provided is an apparatus for processing a substrate including a spin head on which a substrate is placed, a container provided to surround the spin head, an upper nozzle member supplying a processing solution downwards, a bottom cleaning member located to be a certain distance from the bottom of the spin head, wherein the bottom cleaning member sprays a cleaning solution to the bottom of the spin head.

16 Claims, 12 Drawing Sheets

(56) References Cited

U.S. PATENT DOCUMENTS

| | | | | |
|---|---|---|---|---|
| 2006/0086460 A1* | 4/2006 | Kitamura | .......... | H01L 21/67184 |
| | | | | 156/345.31 |
| 2010/0126539 A1 | 5/2010 | Lee et al. | | |
| 2012/0090648 A1* | 4/2012 | Liu | .................. | H01L 21/02063 |
| | | | | 134/33 |

FOREIGN PATENT DOCUMENTS

| | | | | |
|---|---|---|---|---|
| CN | 102124545 A | | 7/2011 |
| KR | 100895862 B1 | | 5/2009 |
| KR | 20100081638 A | | 7/2010 |
| KR | 20110116469 A | * | 10/2011 |
| KR | 20110116469 A | | 10/2011 |
| KR | 20-0465821 Y1 | | 3/2013 |
| KR | 2013-0090213 A | | 8/2013 |
| KR | 20130090213 A | * | 8/2013 |

OTHER PUBLICATIONS

Machine translation of KR2011-0116469A (Year: 2011).*
Machine English Translation of Description of KR 201000081638 (Choi, Jul. 2010).
Machine English Translation of Description of KR 20110116469 A (Pil et al. Oct. 2011).
Machine English Translation of Description of KR 20130090213, cited in IDS (Ik, Aug. 2013).

* cited by examiner

METHOD OF CLEANING AN APPARATUS THAT PROCESSES A SUBSTRATE

CROSS-REFERENCE TO RELATED APPLICATIONS

This U.S. non-provisional patent application is a continuation of U.S. application Ser. No. 15/671,848, filed on Aug. 8, 2017, which is a divisional of U.S. application Ser. No. 14/473,193, filed on Aug. 29, 2014, which claims priority under 35 U.S.C. § 119 of Korean Patent Application Nos. 10-2013-0104070, filed on Aug. 30, 2013, and 10-2013-0165407, filed on Dec. 27, 2013, the entire contents of each of the above-referenced applications are hereby incorporated by reference.

BACKGROUND OF THE INVENTION

The present invention disclosed herein relates to a substrate processing device and a method of cleaning the same.

Semiconductor processes include processes of etching or cleaning a thin film, a foreign material, or a particle on a wafer. These processes are performed in such a manner that a wafer is placed on a spin head, a patterned side up, the spin head is rotated at a high speed, and thus a processing solution is supplied onto the wafer. The processing solution used for processing a substrate may remain in a component such as a spin head, even after the processing of the substrate is completed. Also, a by-product due to the chemical reaction between different processing solutions may be attached to the spin head. Such a remaining processing solution and the by-product cause the defects of the substrate to be processed later.

SUMMARY OF THE INVENTION

The present invention provides a substrate processing apparatus and a method of cleaning the same that may clean a spin head and a container.

Embodiments of the present invention provide apparatuses for processing a substrate including: a spin head on which a substrate is placed; a container provided to surround the spin head; an upper nozzle member supplying a processing solution downwards; a bottom cleaning member located to be a certain distance from the bottom of the spin head, wherein the bottom cleaning member sprays a cleaning solution to the bottom of the spin head.

In some embodiments, the bottom cleaning member may include: a support arm located to be a certain distance from the bottom of the spin head; and a first cleaning nozzle provided on the support arm to face the bottom of the spin head.

In other embodiments, the bottom cleaning member may further include a second cleaning nozzle that is provided on the support arm to be located on the central part of the spin head with respect to the first cleaning nozzle.

In still other embodiments, the bottom cleaning member may further include: a second support arm located to be a certain distance from the bottom of the spin head, wherein the second support arm is shorten than the support arm; and a second cleaning nozzle provided on the secondary support arm to be closer to the central part of the spin head than the first cleaning nozzle.

In even other embodiments, the spin head may include: a body on which the substrate is placed; a chuck pin installed on the body to protrude upwards from the body; and a chuck pin moving unit connected to the lower part of the chuck pin to drive the chuck pin.

In yet other embodiments, the body may include a pin hole located to be capable of moving the chuck pin, and a lower hole connected to the pin hole, the pin hole being formed on the top of the body and the lower hole being formed on the lower part of the body.

In further embodiments, the distance between the first cleaning nozzle and the central axis of the spin head may be equal to the distance between the lower hole and the central axis of the spin head.

In still further embodiments, the body may include a through hole connected to the pin hole and the lower hole, the through hole being formed on a side of the body.

In other embodiments of the present invention, methods of cleaning a apparatus include: spraying a cleaning solution, from a location having a certain distance form the bottom of a spin head rotatably placed in a container having an open top, to the bottom of a spin head, to clean a salt attached to the bottom of the spin head.

In some embodiments, the spraying of the cleaning solution may be performed while a substrate is placed on the spin head.

In other embodiments, the spraying of the cleaning solution may be performed when the spin head rotates.

In still other embodiments, the spraying of the cleaning solution may be performed simultaneously on locations which have different radii from the central part of the spin head.

In even other embodiments, the methods may further include supplying a rinse solution downwards to the top of the spin head to perform cleaning on the top of the spin head and the container together.

In yet other embodiments, the rinse solution may be supplied to a location deviating from the central part of the spin head.

In further embodiments, the spin head alternately may rotate in different directions while the rinse solution is supplied.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
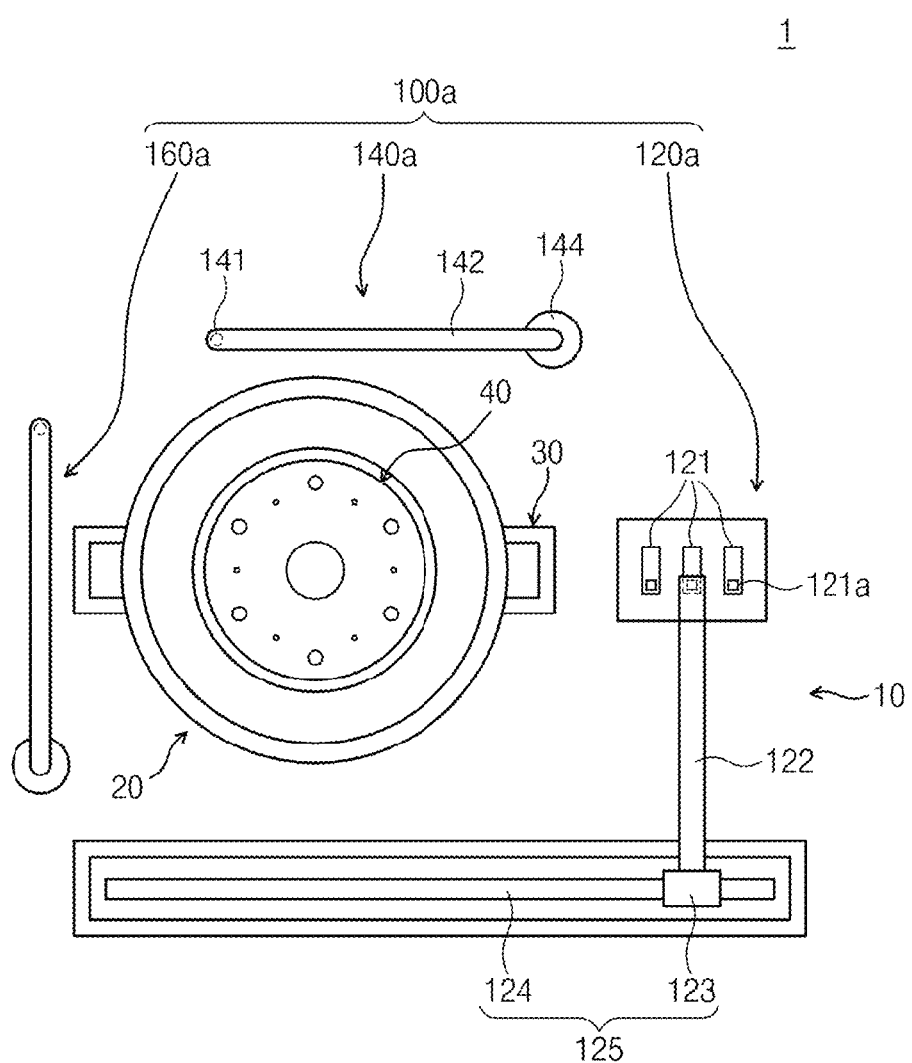
FIG. 1 is a plane view of a substrate processing apparatus according to an embodiment of the present invention.

Embodiments of the present invention are described below in more detail with reference to the accompanying drawings. The embodiments of the present invention may be implemented in many forms, and it should not be construed that the scope of the present invention is limited to the following embodiments. The embodiments are provided to more fully explain the present invention to a person skilled in the art. Thus, the shapes of elements in the drawings are exaggerated to emphasize a more clear description.

FIG. 1 is a plane view of a substrate processing apparatus according to an embodiment of the present invention.

Referring to FIG. 1, a substrate processing apparatus 1 includes a fluid supply unit 10, a container 20, an elevating unit, and a spin head 40.

The fluid supply unit 10 supplies a processing solution or gas for substrate processing to a substrate W. The spin head 40 supports and rotates the substrate W when a process is performed. The container 20 prevents fluid used in a process and a fume emitted during a process from becoming spattered or flowing outwards. The elevating unit 30 vertically moves the spin head 40 or the container 20 and changes the relative height between the container 20 and the spin head 40 in the container 20.

Figure 4:
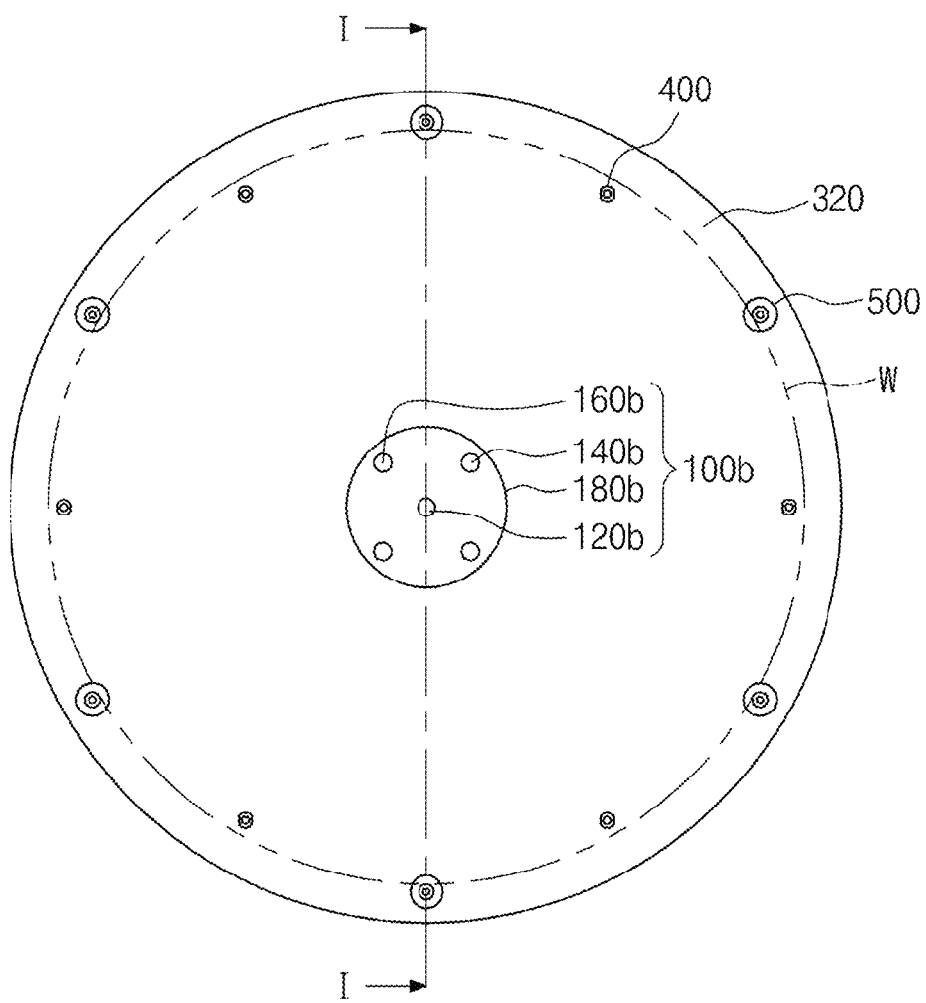
FIG. 4 is a plane view of a spin head.

The fluid supply unit 10 has an upper nozzle member 100a and a lower nozzle member 100b (of FIG. 4). The upper nozzle member 100a supplies a processing solution or gas to the top of the substrate W on the spin head 40, and the lower nozzle member 100b supplies a processing solution or gas to the bottom of the substrate W over the spin head 40. The substrate W is placed over the spin head 40 to be a certain distance from the upper surface of the spin head 40, and the lower nozzle member 100b supplies the processing solution or gas to the space between the spin head 40 and the substrate W.

The upper nozzle member 100a has a fluid supply nozzle 120a, a rinse-solution supply nozzle 140a and a dry-gas supply nozzle 160a. The chemical-solution supply nozzle 120a supplies a plurality of kinds of chemical solutions downwards. The chemical-solution supply nozzle 120a has a plurality of sprays 121, a support bar 122, and a bar moving unit 125. The sprays 121 are arranged on one side of the container 20. The sprays 121 are connected to a chemical-solution storage unit (not shown) and receive chemical-solutions from the chemical-solution storage unit. Each spray 121 is connected to chemical-solution storage units that store different kinds of chemical-solutions. The sprays 121 are arranged side by side in one direction. Each spray 121 may have a protrusion 121a that protrudes upwards, and a recess (not shown) may be formed in a side of the protrusion 121a. Chemical-solutions may be sulfuric acid, nitric acid, ammonia, hydrofluoric acid and mixed fluids that is formed by mixing them with deionized water. A discharge hole is formed at the end of each spray 121.

The support bar 122 may be coupled to any one of the plurality of sprays 121. The support bar 122 may move to the upper part of the substrate W that is placed over the spin head 40. The support bar 122 has a long rod shape and is arranged so that the length direction of the support bar 122 is perpendicular to a direction in which the sprays 121 are arranged. A holder (not shown) for coupling to the spray 121 is provided on the bottom of the support bar 122, and the holder has arms (not shown that may be inserted into the recess formed in the protrusion 121a of the spray 121. The arms may be provided with a structure in which they may rotate or move from the outside of the protrusion 121a toward the recess of the protrusion 121a.

The bar moving unit 125 linearly moves the support bar 122 between the upper part of the substrate W over the spin head 40 and the upper parts of the sprays 121. The bar moving unit 125 has a bracket 123, a guide rail 124, and a driver (not shown). The guide rail 124 is linearly extended from the outside of the sprays 121 to the spray 121, and to the outside of the container 20 passing by the container 20. The bracket 123 is coupled to the guide rail 124 along which the bracket 123 may move, and the support bar 122 is coupled and fixed to the bracket 123. The driver provides a driving force that linearly moves the bracket 123. The linear movement of the bracket 123 may be performed by an assembly that has a motor and a screw. Selectively, the linear movement of the bracket 123 may be performed by an assembly that has a belt, a pulley and a motor. Selectively, the linear movement of the bracket 123 may be performed by a linear motor.

The rinse-solution supply nozzle 140a is arranged on one side of the container 20, and the dry-gas supply nozzle 160a is arranged on the other side of the container 20. The rinse-solution supply nozzle 140a has a spray 141, a support bar 142, and a driver 144. The spray 141 is coupled and fixed to one end of the support bar 142. A rotation axis (not shown) rotated by the driver 144 is coupled and fixed to the other end of the support bar 142. The spray 141 receives a rinse solution from the rinse-solution storage unit (not shown). The dry-gas supply nozzle 160a has a generally similar structure to the rinse-solution supply nozzle 140a. The dry-gas supply nozzle 160a supplies isopropyl alcohol and a nitrogen gas. The nitrogen gas may be a heated nitrogen gas.

The chemical-solution, rinse-solution and dry gas supplied from the upper nozzle member 100a and the lower nozzle member 100b are spread from the central region of the top or bottom of the substrate W to the edge thereof by the rotation of the spin head 40 to clean the substrate W.

Figure 2:
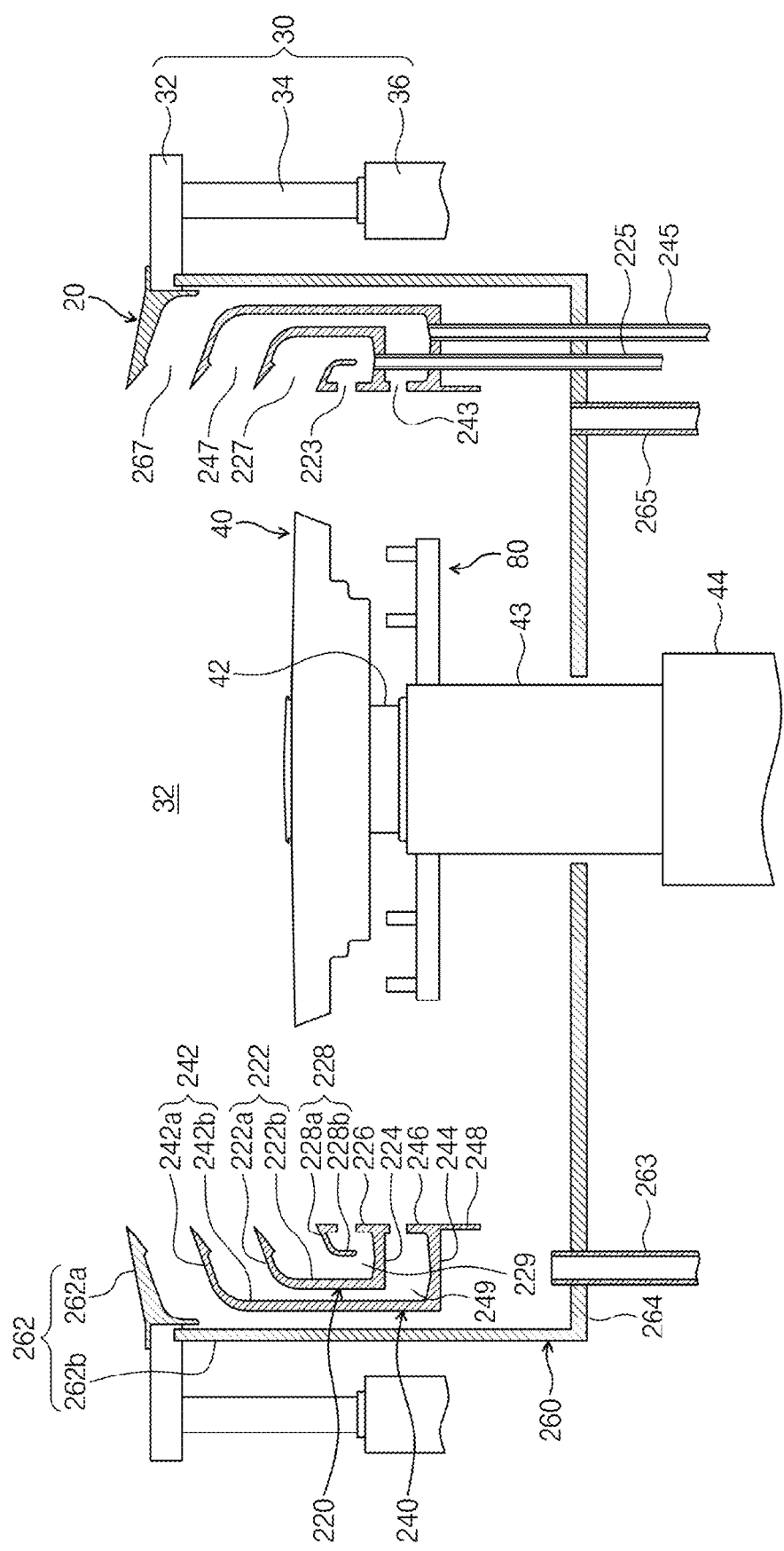
FIG. 2 is a longitudinal sectional view of a substrate processing apparatus.
Figure 3:
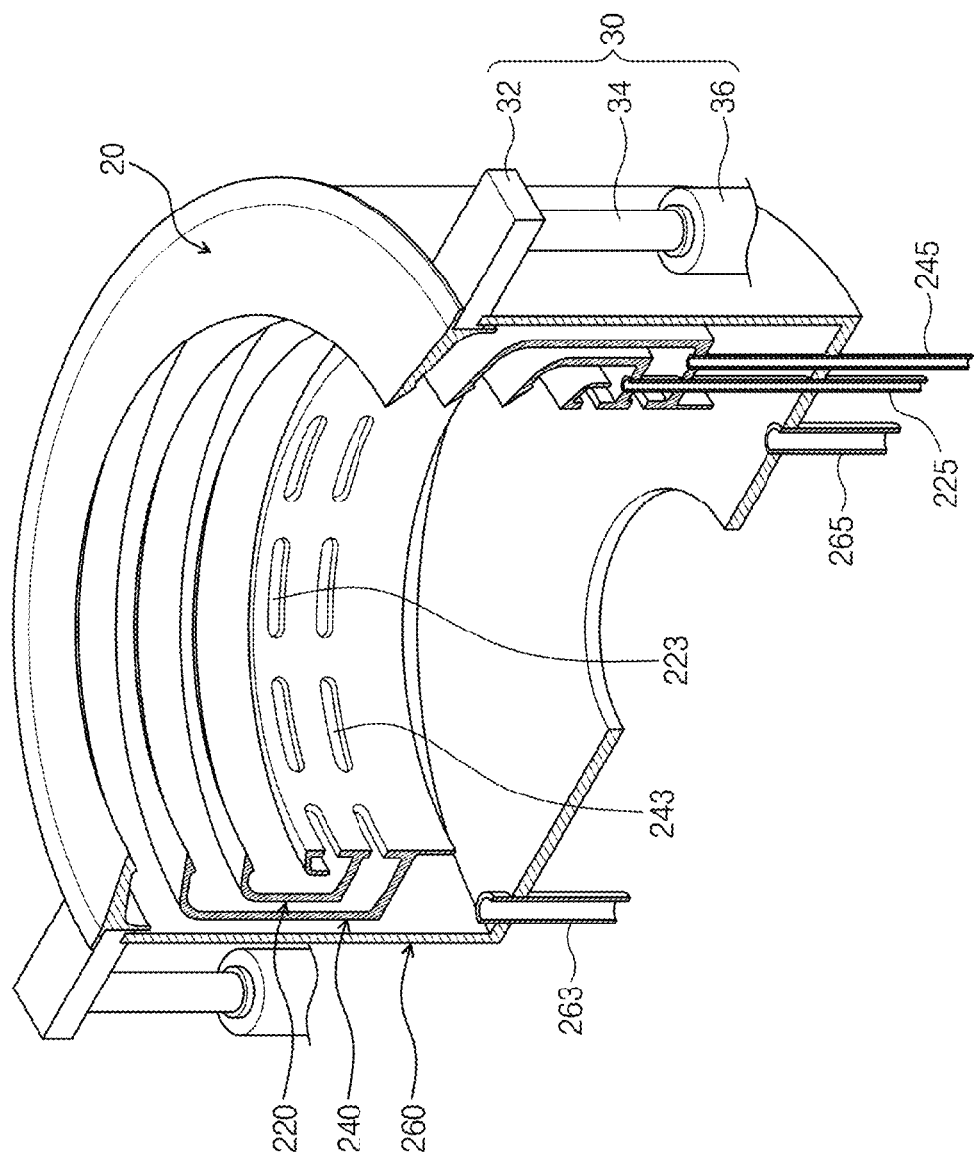
FIG. 3 is a longitudinal sectional perspective view of a container.

FIG. 2 is a longitudinal sectional view of a substrate processing apparatus, and FIG. 3 is a longitudinal sectional perspective view of a container.

Referring to FIGS. 2 and 3, the container 20 has a space 32 which has an open top and in which the substrate W is processed, and the spin head 40 is arranged in the space 32. The rotation axis 42 that supports and rotates the spin head 40 is coupled and fixed to the bottom of the spin head 40. The rotation axis 42 protrudes to the outside of the container 20 through an opening formed in the bottom of the container 20. The driver such as a motor that provides torque is coupled and fixed to the rotation axis 42. An axis housing 43 surrounds the external circumferential surface of the rotation axis 42.

The container 20 has a structure in which chemical-solutions used in a process may be separated and collected. This enables chemical-solutions to be re-used. The container 20 has a plurality of collection tanks 220, 240 and 260. Each collection tank 220, 240 or 260 collects different kinds of processing solutions among processing solutions used in a process. In the present embodiment, the container 20 has three collection tanks. Collection tanks are referred to as an internal collection tank 220, an intermediate collection tank 240, and an external collection tank, respectively.

The internal collection tank is provided in the shape of a circular ring surrounding the spin head 40, the intermediate collection tank 240 is provided in the shape of a circular ring surrounding the internal collection tank 220, and the external collection tank 260 is provided in the shape of a circular ring surrounding the intermediate collection tank 240. The collection tanks 220, 240 and 260 have, in the container 20, inlets 227, 247 and 267, respectively communicating with the space 42 in the container 20. Each inlet 227, 247, or 267 is provided in the shape of a ring on the circumference of the spin head 40. Chemical-solutions sprayed to the substrate W and used in a process flows into the collection tanks 220, 240, and 260 through the inlets 227, 247, and 267 by centrifugal force due to the rotation of the substrate W. The inlet 267 of the external collection tank 260 is provided over the inlet 247 of the intermediate collection tank 240, and the inlet 247 of the intermediate collection tank 240 is provided over the inlet 227 of the internal collection tank 220. That is, the inlets 227, 247 and 267 of the internal collection tank 220, the intermediate collection tank 240, and the external collection tank 260 are provided so that they have different heights.

The internal collection tank 220 has an external wall 222, a bottom wall 224, an internal wall 226, and a guide wall 228. Each of the external wall 222, the bottom wall 224, the internal wall 226, and the guide wall 228 has a ring shape. The external wall 222 has a slope wall 222a sloping to be away from the spin head 40 and a vertical wall 222b extended vertically downwards from the lower end of the slope wall 222a. The bottom wall 224 is extended horizontally from the lower end of the vertical wall 222b toward the spin head 40. The end of the bottom wall 224 is extended to the same location to the upper end of the slope wall 222a. The internal wall 226 is extended vertically upwards from the internal end of the bottom 224. The internal wall 226 is extended to a location at which the upper end of the internal wall 226 is a certain distance from the upper end of the slope wall 222a. The space between the internal wall 226 and the slope wall 222a functions as the inlet 227 of the internal collection tank 220 as described above.

A plurality of openings 223 is formed on the internal wall 226 to form a ring. Each opening 223 is provided in a slit shape. The opening 223 functions as an exhaust hole that enables gases flowing into the internal collection tank 220 to be externally discharged through a lower space in the spin head 40. A discharge pipe 225 is coupled to the bottom wall 224. The processing solution flowing into the internal collection tank 220 is discharged to an external chemical-solution recycling system through the discharge pipe 225.

The guide wall 228 has a slope wall 228a sloping to be away from the spin head 40 from the upper end of the internal wall 226 and a vertical wall 228h extended vertically downwards from the lower end of the slope wall 228a. The lower end of the vertical wall 228b is located to be a certain distance from the bottom wall 224. The guide wall 228 guide a processing solution flowing into the inlet 227 so that the processing solution may easily flow to a space 229 surrounded by the external wall 222, the bottom wall 224, and the internal wall 226.

The intermediate collection tank 240 has an external wall 242, a bottom wall 244, an internal wall 246, and a protrusion wall 248. The external wall 242, the bottom wall 244, and the internal wall 246 of the intermediate collection tank 240 have a generally similar shape to the external wall 222, the bottom 224, and the internal wall 226 of the internal collection tank 220 but the intermediate collection tank 240 has a larger size compared with the internal collection tank 220 so that the intermediate collection tank 240 surrounds the internal collection tank 220. The upper end of the slope wall 242a of the external wall 242 of the intermediate collection tank 240 and the upper end of the slope wall 222a of the external wall 222 of the internal collection tank 220 are located to be a certain distance in a vertical direction, and the space functions as the inlet 247 of the intermediate collection tank 240. The protrusion wall 248 is extended vertically downwards from the end of the bottom 244. The upper end of the internal wall 246 of the intermediate collection tank 240 is in contact with the end of the bottom wall 224 of the internal collection tank 220. Slit-shaped exhaust holes 243 for discharging a gas are provided on the internal wall 246 of the intermediate collection tank 240 to form a ring. The discharge pipe 245 is coupled to the bottom wall 244, and the processing solution flowing into the intermediate collection tank 240 is discharged to an external chemical-solution recycling system through the discharge pipe 245.

The external collection tank 260 has an external wall 262 and a bottom wall 264. The external wall 262 of the external collection tank 260 has a similar shape to the external wall 242 of the intermediate collection tank 240 but has a larger size compared with the intermediate collection tank 240 so that the external collection tank 260 surrounds the intermediate collection tank 240. The upper end of the slope wall 262a of the external wall 262 of the external collection tank 260 and the upper end of the slope wall 242a of the external wall 242 of the intermediate collection tank 240 are located to be a certain distance in a vertical direction, and the space functions as the inlet 267 of the external collection tank 260. The bottom wall 264 generally has a disc shape, and an opening into which the rotation axis 42 is inserted is formed on the central part of the bottom wall 264. A discharge pipe 265 is coupled to the bottom wall 264, and the processing solution flowing into the external collection tank 260 is discharged to an external chemical-solution recycling system through the discharge pipe 265. The external collection tank 260 functions as the external wall of the container 20.

A discharge pipe 263 is coupled to the bottom wall 264 of the external collection tank 260 and the gas flowing into the external collection tank 260 is externally discharged through the discharge pipe 263. Also, the gas flowing from the discharge hole 223 provided on the internal wall 226 of the internal collection tank 220 and the discharge hole 243 provided on the internal wall 246 of the intermediate collection tank 240 is externally discharged through the discharge pipe 263 connected to the external collection tank 260. The discharge pipe 263 is installed to protrude upwards a certain distance from the bottom wall 264.

The elevating unit 30 moves the container 20 linearly in a vertical direction. As the container 20 vertically moves, the height of the container 20 relative to the spin head 40 changes. The elevating unit 30 has a bracket 31, a moving axis 34, and a driver (36). The bracket 31 is installed and fixed to the external wall of the container 20, and the moving axis 34 that moves in a vertical direction by the driver 36 is coupled and fixed to the bracket 31. When the substrate W is placed on the spin head 40 or when raising the substrate W from the spin head 40, the container 20 goes down so that the spin head 40 protrudes upwards to be exposed from the container 20. Also, when a process is performed, the height of the container 20 is adjusted according to the kind of a processing solution supplied to the substrate W so that the processing solution may flow into the collection tanks 220, 240, and 260. On the contrary, the elevating unit 30 may move the spin head 40 in a vertical direction.

Figure 5:
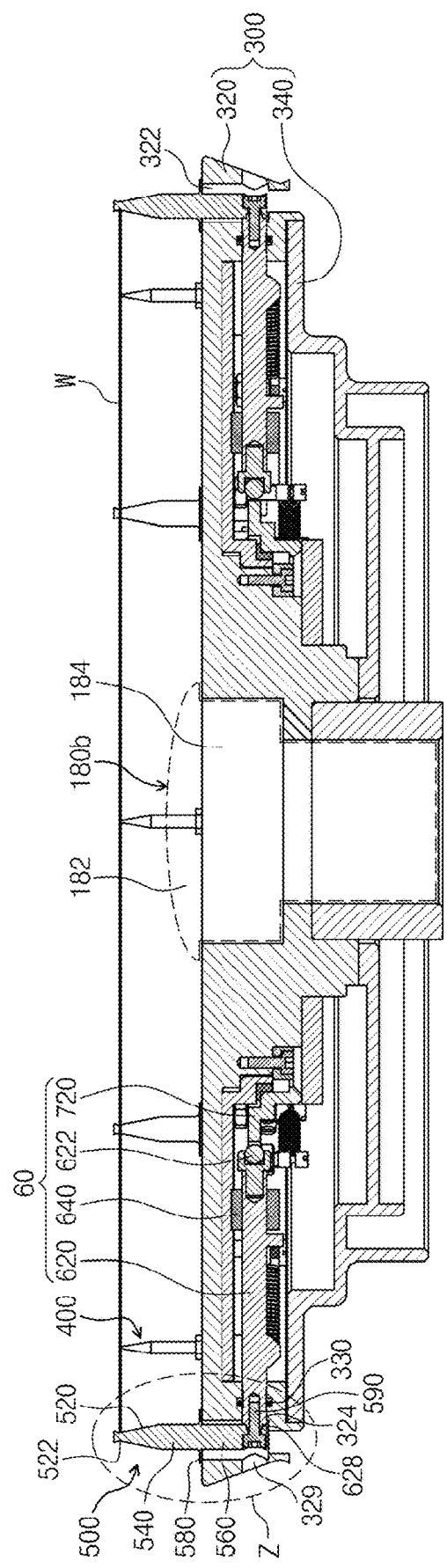
FIG. 5 is a cross sectional view taken along line I-I of FIG. 4.

FIG. 4 is a plane view of a spin head, and FIG. 5 is a cross sectional view taken along line I-I of FIG. 4.

Referring to FIGS. 1 to 4, the spin head 40 has the lower nozzle member 100*b*, a body 300, support pins 400, chuck pins 500, and a chuck pin moving unit 600.

The lower nozzle member 100*b* has a spray head 180*b*. The spray head 180*b* has a head portion 182 and an insertion portion 184. The head portion 182 has a convex shape and protrudes upwards from the spin head 40. The head portion 182 has a plurality of jet holes. The jets spray any one of a plurality of chemical solutions, a rinse solution, isopropyl alcohol or a dry gas such as a nitrogen gas. The insertion portion 184 has a diameter smaller than the lower end of the head portion 182 and constant in a length direction, and is extended downwards from the head portion 182. The insertion portion 184 is inserted into a through hole that is formed on the central part of the spin head 40.

The support pins 400 supports the rear edge of the substrate W so that the substrate W is a certain distance from the top of the body 300. The support pins 400 all have the same shape and size. The support pin 400 has an upper portion that gradually widens progressively downward, and a lower portion that is extended therefrom and has a constant diameter. A screw portion formed at the lower end of the support pin 400 is coupled to a recess corresponding to the screw portion on the top of the body 300, so the support pin 400 is fixed to the body 300.

The chuck pin 500 is installed at the edge region of the body 300 to protrude upwards from the top of the body 300. The chuck pin 500 may be provided in plurality. The chuck pin 500 supports a side of the substrate W so that the substrate W departs laterally from a right location when the spin head 40 rotates. The chuck pins 500 all have the same shape and size. The chuck pin 500 has a support portion 520, a central portion 540, a fastening portion 560, and a stopping portion 580. The support portion 520 has a diameter that gradually narrows progressively downward form its flat top and then gradually widens progressively downward. Thus, the support portion 520 has a concave portion 522 that is concave when viewed from the front. A side of the substrate W on the support pin 400 is in contact with the concave portion 522. The central portion 540 is extended downwards from the lower end of the support portion 520 with the same diameter to the lower end. The fastening portion 560 is extended downwards from the central portion 540. The fastening portion 560 has a screw hole for coupling to the chuck pin moving unit 600. The stopping portion 580 is extended outwards from the central portion 540 and is provided in a ring shape. The stopping portion 580 is in close contact with the upper surface of the body 300 and enables the chuck pins 500 all to have the same height.

The body 300 has an upper plate 320 and a lower plate 340. The upper plate 320 generally has a circular top when viewed from the top. The lower plate 340 is arranged under the upper plate 320 and provides a space in which the chuck pin moving unit 600 is arranged. The edge region of the upper plate 320 has a pin hole 322 into which the chuck pins 500 are inserted. Each pin hole 322 has a slit shape. The pin hole 322 is formed so that its length direction follows the radial direction of the upper plate 320. The width of the pin hole 322 is formed to be equal to or rather wider than the diameter of the central portion 540 of the chuck pin 500, and the length of the pin hole 322 is formed to be capable of guiding a movement to the radial direction of the chuck pin 500. The length of the pin hole 322 may be shorter than the diameter of the stopping portion 580 of the chuck pin 500. Alternatively, the pine hole 322 may have a circular shape.

In this case, the diameter of the pin hole 322 may be longer than the diameter of the central portion 540 of the chuck pin 500 and shorter than the diameter of the stopping portion 580. Through holes into which the above-described spray head 180*b* is inserted is formed in the central portions of the upper plate 320 and the lower plate 340.

The chuck pin moving unit 600 has a moving rod 620, a guide member 640, and a cam 720.

The chuck pin moving unit 600 moves the chuck pin 500 between a support location and a standby location. The support location indicates a location at which the chuck pins 500 are in contact with a side of the substrate W when a process is performed, and the standby location indicates a location at which a space wider than the substrate W is provided so that the substrate W may be placed on the spin head 40. Thus, the support location is closer to the central portion of the body 300 compared with the standby location.

Since the upper place 320 is exposed to a chemical solution when a process is performed, the upper plate 320 is made of a material having corrosion resistance to the chemical solution. Also, the lower plate 340 is made of a heat-resistant material so that the setting location of the chuck pin 500 does not go wrong due to the thermal inflation of the lower plate 340 when a process is performed, by supplying a high-temperature chemical solution to the substrate W. In the present invention, the upper plate 320 is made of a material more resistant to corrosion compared with the lower plate 340, and the lower plate 340 is made of a material having less thermal strain compared with the upper plate 320. According to an example, the upper plate 320 is made of a polyvinyl chloride material and the lower plate 340 is made of an aluminum material.

The upper plate 320 has a side portion 321 extended downwards from the edge. The side portion 321 includes a through hole 329 that is formed inwards from the external surface. The through hole 329 is connected to the pin hole 322. A lower hole 323 is formed upwards from the bottom of the side portion 321. A hole 324 is formed outwards from the internal part of the side portion 321. The pin hole 322, the lower hole 323, the hole 324, and the through hole 329 are provided to be connected one another.

The moving rod 620 has the same number as the chuck pin 500 and one chuck pin 500 is coupled to each moving rod 620. The moving rod 620 is arranged in a space formed between the upper plate 320 and the lower plate 340 in the same direction as the radial direction of the body 300. One external end of the moving rod 620 is located in the hole 324. A screen recess 628 is formed at one external end of the moving rod 620, and the chuck pin 500 and the moving rod 620 are coupled and fixed each other by a screw 590. Also, a sealing member 330 that surrounds the moving rod 620 and seals a space among an outside, the upper plate 320 and the lower plate 340 is installed in the hole 324. An O-ring is used as the sealing member 330. The moving rod 620 has a rolling ball 622 at an internal end. The rolling ball 622 is coupled to the moving rod 620 to be capable of rotating with respect to the moving rod 620.

The guide member 640 that guides so that the moving rod 620 linearly moves in a radial direction is provided on the moving path of each moving rod 620. A sliding bearing may be used as the guide member 640. The sliding hearing is coupled and fixed to the body 300.

The moving rod 620 is in touch with the cam 720. The cam 720 linearly moves by a cam driver (not shown). The linear movement of the cam 720 is transferred to the moving rod 620. Thus, according to the movement of the moving rod 620, the chuck pin 500 is located at the support location or the standby location.

Figure 6:
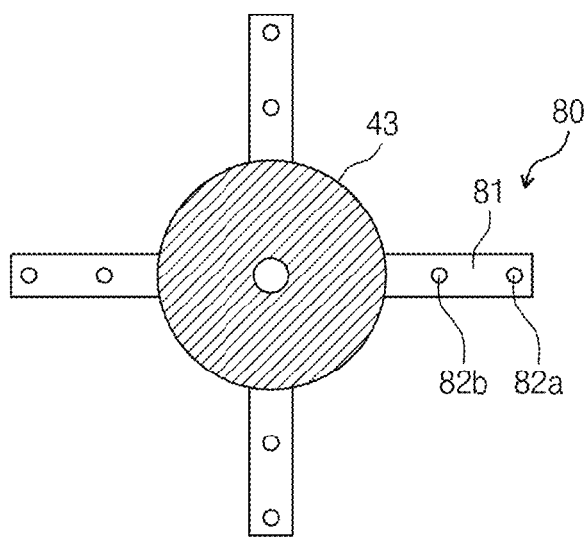
FIG. 6 is a plane view of a shaft housing portion while a spin head is separated.
Figure 7:
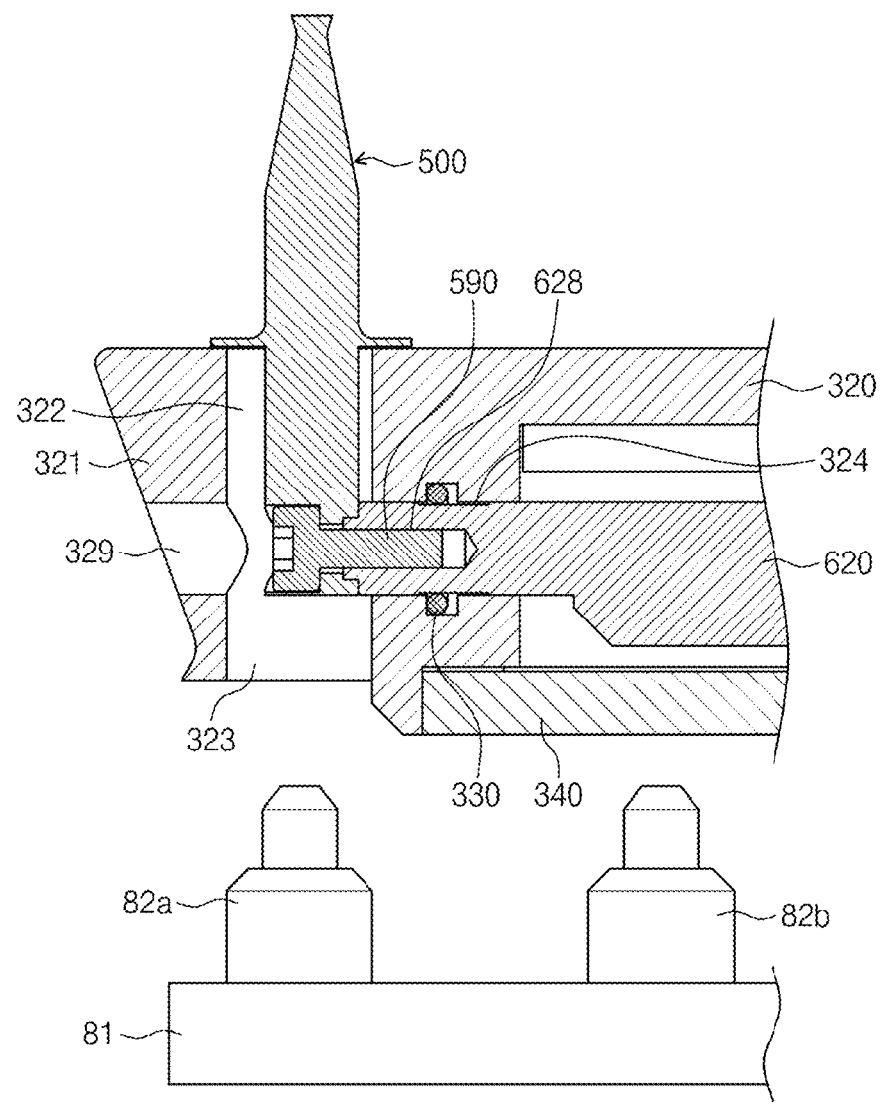
FIG. 7 shows enlarged views of portion Z of FIG. 5 and a bottom cleaning member placed thereunder.

FIG. 6 is a plane view of a shaft housing portion while a spin head is separated, and FIG. 7 shows enlarged views of portion Z of FIG. 5 and a bottom cleaning member placed thereunder.

Referring to FIGS. 1 to 7, bottom cleaning members 80 are provided under the spin head 40. The bottom cleaning member 80 includes a support arm 81 and cleaning nozzles 82a and 82b.

The support arm 81 is located to be a certain distance from the bottom of the spin head 40. As an example, the support arm 81 may be provided to be extended from the external circumferential surface of the axis housing 43 toward the container 20. Also, the support arm 81 may be provided to be extended from the internal circumferential surface of the container 20 toward the axis housing 43. A plurality of support arms 81 may be provided which is a certain distance from one another.

The cleaning nozzles 82a and 82b are located at the support arm 81 to face the bottom of the spin head 40. The cleaning nozzles 82a and 82b are connected to a cleaning-solution supply unit (not shown) through a line (not shown). The cleaning nozzles 82a and 82b include a first cleaning nozzle 82a and a second cleaning nozzle 82b.

The first cleaning nozzle 82a may be provided so that a jet through which a cleaning solution is sprayed may be located under the lower hole 323. That is, the distance between the central axis of the spin head 40 and the lower hole 323 may be equal to the distance between the central axis of the spin head 40 and the jet of the first cleaning nozzle 82a. Also, the first cleaning nozzle 82a may be equal to the chuck pin 500 in number. In addition, in order that the first cleaning nozzles 82a may be together located at the lower hole 323, the support arms 81 may be provided to have the same distance as the distance of adjacent chuck pins 500.

The second cleaning nozzle 82b is provided to be located at the central part of the spin head 40 relative to the first cleaning nozzle 82a.

Figure 8:
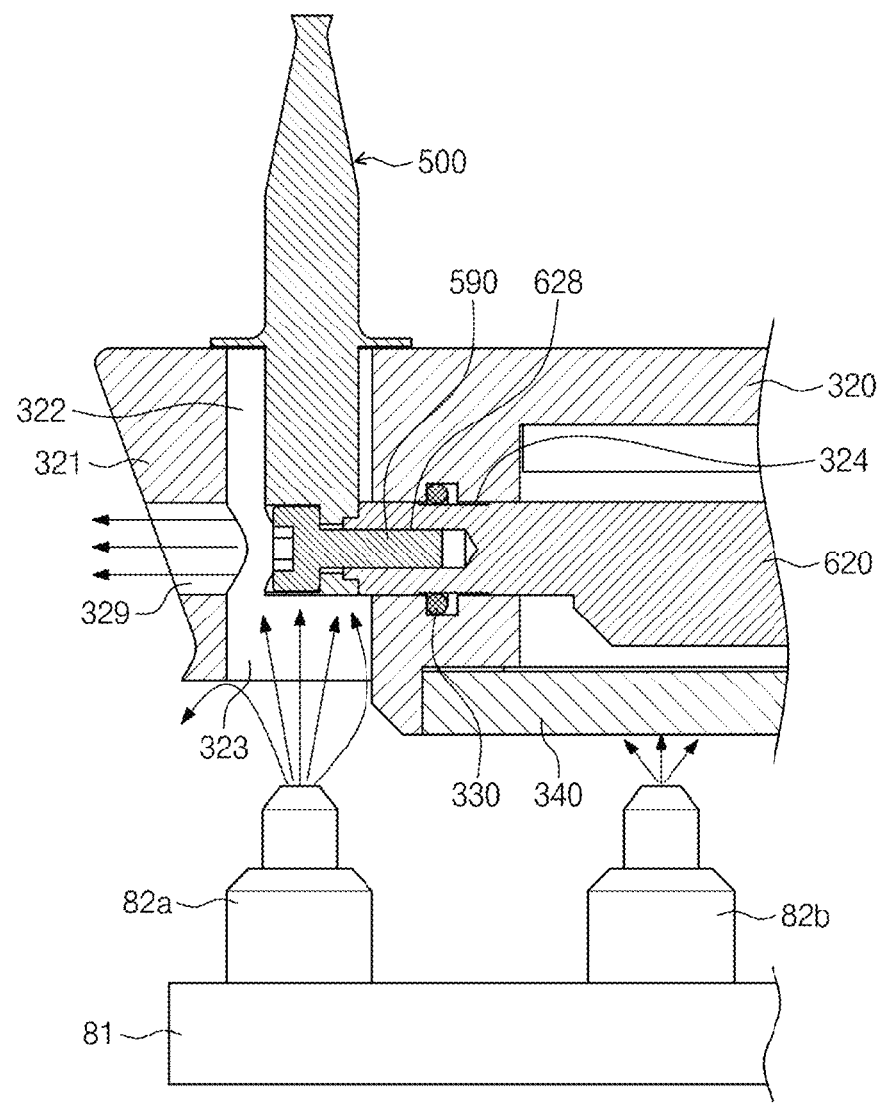
FIG. 8 represents when a cleaning solution is sprayed form a bottom cleaning member.

FIG. 8 represents when a cleaning solution is sprayed form a bottom cleaning member.

Referring to FIGS. 1 to 8, the cleaning nozzles 82a and 82b of the bottom cleaning member 80 spray a cleaning solution to the bottom of the spin head 40. The bottom cleaning member 80 may spray a cleaning solution when there is no substrate on the spin head 40. Also, the bottom cleaning member 80 may also spray the cleaning solution while a substrate placed on the spin head 40 is processed.

The cleaning solution may be deionized water (DIW). While the cleaning water is sprayed, the spin head 40 may rotate. When the lower hole 323 is located at the upper part of the first cleaning nozzle 82a with the rotation of the spin head 40, the cleaning solution sprayed from the first cleaning nozzle 82a is sprayed directly to the lower part of the chuck pin 500 through the lower hole 323. The cleaning solution may be sprayed to the internal wall of the container 20 through the through hole 329 after cleaning the lower part of the chuck pin 500. The cleaning solution sprayed from the second cleaning nozzle 82b cleans the bottom of the spin head 40. Also, the cleaning solution sprayed from the cleaning nozzles 82a and 82b to the bottom of the spin head 40 may be spattered toward the container 20 with the rotation of the spin head 40 and clean the internal wall of the container 20.

A processing solution supplied from the fluid supply unit 10 for processing a substrate may be sprayed at a high temperature. As an example, when the processing solution is sulfuric acid, the sulfuric acid is sprayed at a temperature of 140° C. to 200° C. Also, when the processing solution supplied from the fluid supply unit 10 includes an acidic solution and a basic solution, a salt may be made by the reaction of these solutions. Such a salt is attached to the spin head 40 or the container 20. Such a salt may be attached to the substrate W to be processed later and thus cause a defect. Also, these solutions may flow into the pin hole 322 and thus generate a fume from the lower part of the chuck pin 500 or the moving rod 620. Also, due to the thermal strain of the spin head 40, the chuck pin 500 may not be in close contact with a side of the substrate.

The cleaning solution sprayed from the bottom cleaning member 80 cleans the fume generated from the lower part of the chuck pin 500. Also, the cleaning solution may be sprayed at a lower temperature than sulfuric acid. When the cleaning solution is sprayed to the lower hole 323 and the body 300, the chuck pin 500 and the body 300 are cooled. Thus, the thermal strain of the spin head 40 may be prevented or the level of the thermal strain decreases. Also, the cleaning solution is sprayed toward the internal wall of the container 20 and thus cleans the internal wall of the container 20. As an example, the cleaning solution may be sprayed at room temperatures.

Figure 9:
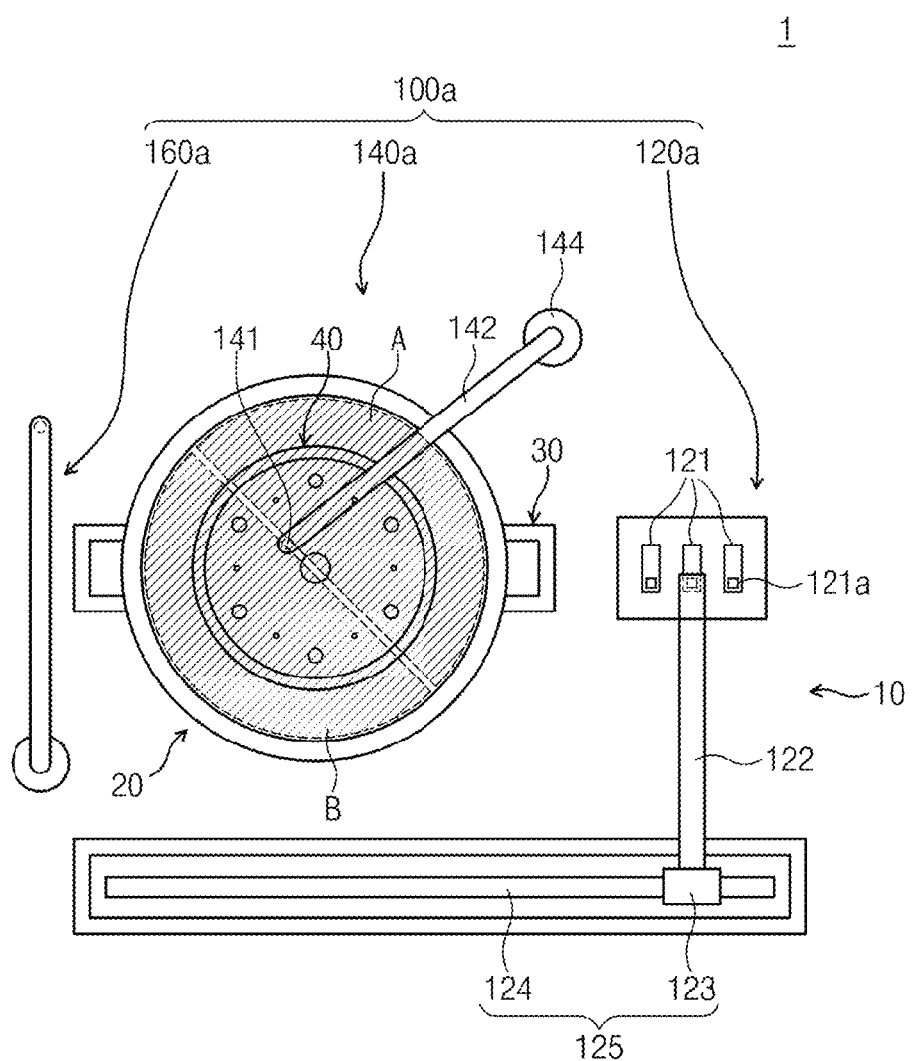
FIGS. 9 to 11 represent when a rinse-solution supply nozzle cleans a spin head and a container.
Figure 10:
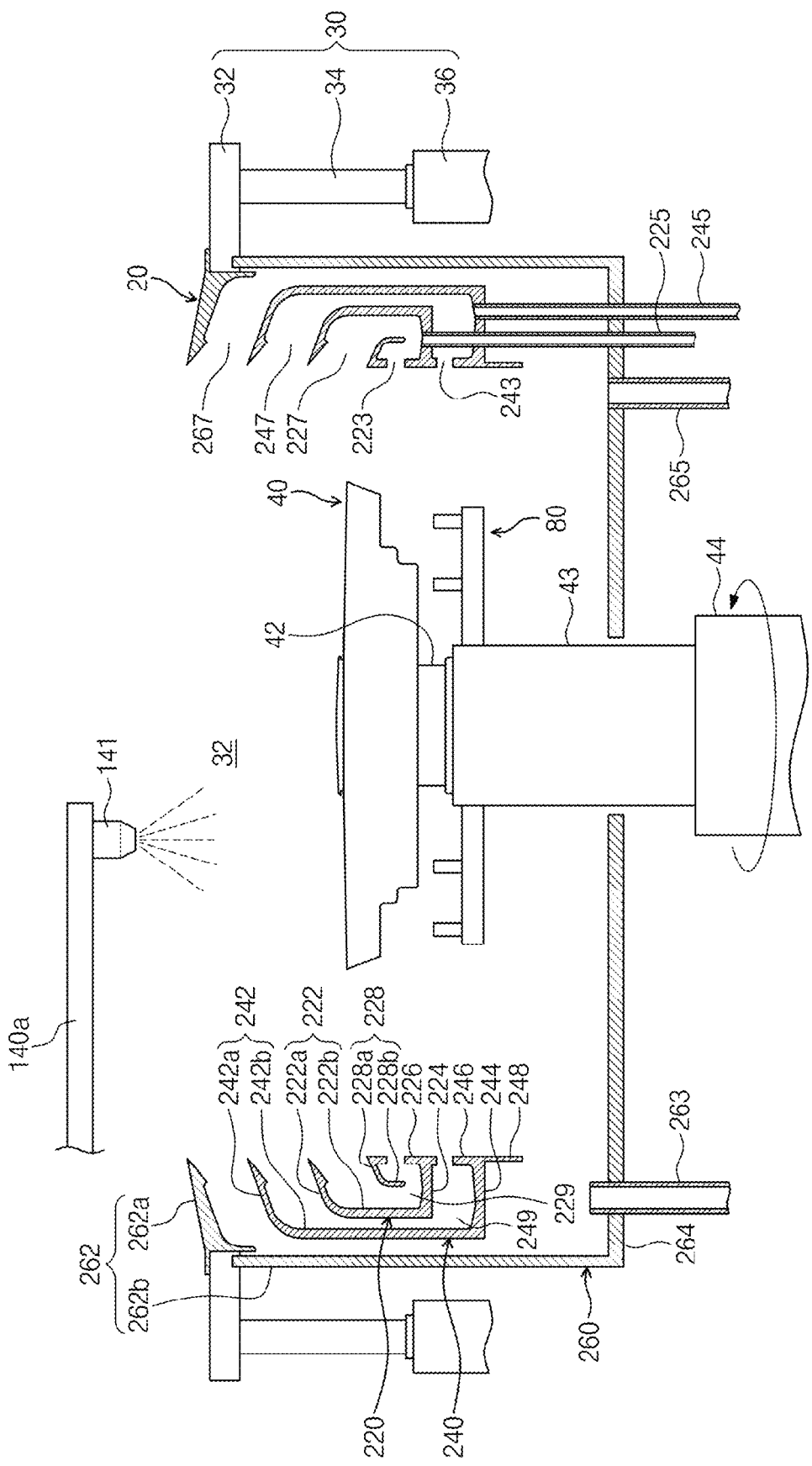
Figure 11:
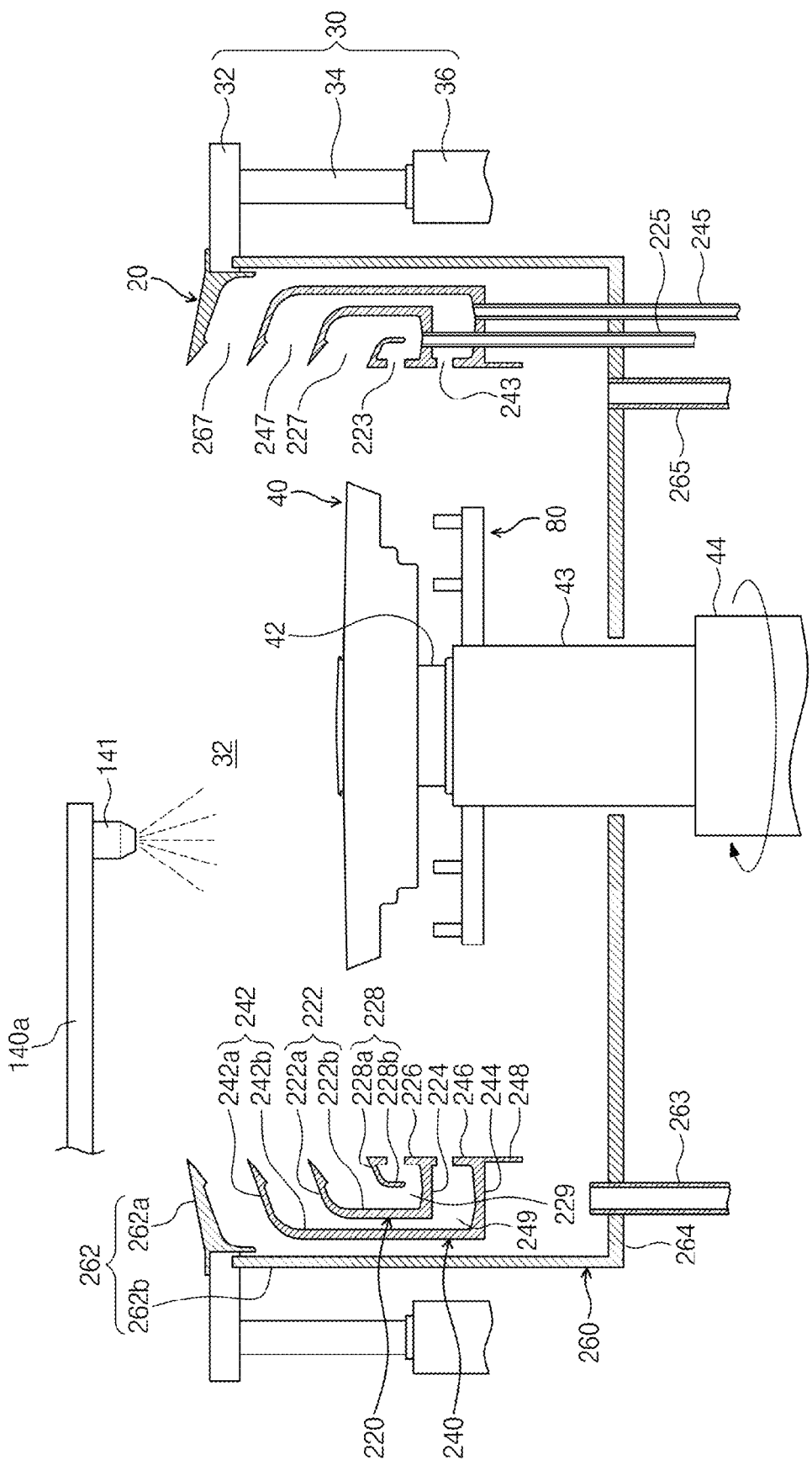

FIGS. 9 to 11 represent when a rinse-solution supply nozzle cleans a spin head and a container.

Referring to FIGS. 1 to 11, the rinse-solution supply nozzle 140a may perform cleaning on the spin head 40 and the container 20.

The rinse-solution supply nozzle 140a sprays a rinse solution to the spin head 40, while there is no substrate W on the spin head 40. The rinse solution sprayed to the spin head 40 may perform cleaning on the top of the spin head 40, the support pins 400 and the chuck pins 500. A target to be cleaned by the rinse solution may be a salt generated by the reaction of processing solutions. While the rinse solution is supplied, the spin head 40 may rotate. With the rotation of the spin head 40, the rinse solution may be sprayed from the top of the spin head 40 toward the internal wall of the container 20. The rinse solution sprayed to the container 20 cleans the internal wall of the container 20. Cleaning by the rinse-solution supply nozzle 140a may be performed simultaneously with the cleaning by the bottom cleaning member 80. Also, cleaning by the rinse-solution supply nozzle 140a may also be performed separately from the cleaning by the bottom cleaning member 80.

The rinse-solution supply nozzle 140a may supply the rinse solution to a location deviating from the central part of the spin head 40. In particular, the rinse-solution supply nozzle 140a may supply the rinse solution while a spray is located at a location deviating from the upper part of the lower nozzle member. Thus, a flow of the rinse solution sprayed from the rinse-solution supply nozzle 140a into the lower nozzle 100b may be minimized. Also, a centrifugal force applied to the rinse solution increases due to the rotation of the spin head 40, so the speed of the rinse solution sprayed to the internal wall of the container 200 may increase. An increase in speed of the rinse solution sprayed enhances the cleanliness of the internal wall of the container 20.

While the rinse solution is sprayed, the spin head 40 may alternately rotate counterclockwise as shown in FIG. 10 and clockwise as shown in FIG. 11. When the spin head 40 rotates counterclockwise, the rinse solution is mainly sprayed to the internal wall of the container 20 of region A from the spin head 40. In addition, when the spin head 40 rotates clockwise, the rinse solution is mainly sprayed to the internal wall of the container 20 of region B from the spin head 40.

Figure 12:
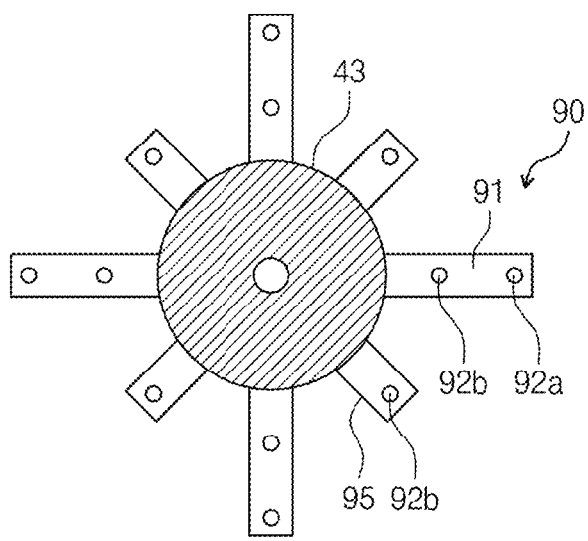
FIG. 12 represents a shaft housing on which a bottom cleaning member according to another embodiment is provided.

FIG. 12 represents a shaft housing on which a bottom cleaning member according to another embodiment is provided.

Referring to FIG. 12, the bottom cleaning member 90 includes a support arm 91 and a secondary support arm 95.

The support arm 91 is provided to have a length corresponding to the radius of the spin head 40. The support arm 91 may be provided in plurality along the circumference of the axis housing 43. The support arm 91 is provided with a first cleaning nozzle 92*a* and a second cleaning nozzle 92*b*.

The secondary support arm 95 is shorter than the support arm 91. The secondary support arm 95 may be provided in plurality along the circumference of the axis housing 43. Also, each secondary support arm 95 may be located between adjacent supports. The secondary support arm 95 is provided with the second cleaning nozzle 92*b*.

Since the location and operation of the first cleaning nozzle 92*a* and the second cleaning nozzle 92*b* relative to the spin head 40 are the same as those of the bottom cleaning member 80 in FIG. 6, repetitive descriptions are left out.

As another embodiment, the second nozzle provided with the support arm 91 may be left out.

According to an embodiment of the present invention, it is possible to clean the spin head and the container.

The detailed descriptions above show examples of the present invention. Also, the above description represents exemplary embodiments and the present invention may be used under various different combinations, changes and environments. That is, it is possible to make a change or modification within the scope of the concept of the invention disclosed herein, within a scope equivalent to the disclosure and/or within the scope of the technique or knowledge of the related art. The above-described embodiments are provided with best mode for implementing the technical spirit of the present invention and various changes needed for the particular applications and use of the present invention may also be implemented. Thus, the detailed description of the invention is not intended to limit the present invention to the embodiments disclosed. Also, the following claims should be construed to include other embodiments.

What is claimed is:

1. A method of cleaning an apparatus, the apparatus configured to process a substrate supported on a spin head, the method comprising:
   spraying a cleaning solution toward a bottom of the spin head, the spin head being in a container;
   supplying a rinse solution to a top of the spin head to perform cleaning on the top of the spin head and on an interior wall of the container,
   the rinse solution is supplied toward a location deviating from a central part of the spin head, and
   the spraying the cleaning solution including spraying the cleaning solution from a first cleaning nozzle into a first hole in the spin head to have the cleaning solution travel a first distance and concurrently spraying the cleaning solution from a second cleaning nozzle onto the bottom of the spin head to have the cleaning solution travel a second distance, less than the first distance, and while keeping a fixed distance between the first cleaning nozzle and the second cleaning nozzle, wherein
   a support arm is at a first distance from the bottom of the spin head,
   the first cleaning nozzle and the second cleaning nozzle are on the support arm at the fixed distance from each other,
   the spraying the cleaning solution is performed simultaneously with the supplying the rinse solution, and
   the spin head changes a rotating direction while the rinse solution and the cleaning solution are supplied.

2. The method of claim 1, wherein the spraying the cleaning solution includes,
   ejecting the cleaning solution vertically to the bottom of the spin head from the first and the second cleaning nozzle.

3. The method of claim 1, wherein the second cleaning nozzle located at a central part of the spin head relative to the first cleaning nozzle.

4. The method of claim 1, wherein while the rinse solution is supplied, the spin head alternates between rotating in a clockwise direction and in a counterclockwise direction.

5. The method of claim 4, wherein while the spin head rotates in the clockwise direction, the rinse solution is sprayed onto a first region of the interior wall of the container, and
   while the spin head rotates in the counterclockwise direction, the rinse solution is sprayed onto a second region of the interior wall of the container.

6. The method of claim 1, wherein the spraying the cleaning solution includes,
   spraying the cleaning solution from a third nozzle into a second hole in the spin head and spraying the cleaning solution from a fourth nozzle onto the bottom of the spin head, wherein
   the third nozzle and the fourth nozzle on a second support arm, and
   a second distance between the third nozzle and the fourth nozzle is maintained as the second distance between the third nozzle and the fourth nozzle during the processing of the substrate.

7. The method of claim 1, wherein the first cleaning nozzle and the second cleaning nozzle are on the support arm along an imaginary line that extends across a diameter of the spin head.

8. The method of claim 1, wherein a secondary support arm is at the first distance from the bottom of the spin head, and
   the secondary support arm is shorter than the support arm and the secondary support arm includes a third cleaning nozzle located at a same radial distance from a central axis of the spin head as the second cleaning nozzle in the support arm.

9. A method of cleaning an apparatus configured to process a substrate supported on a spin head, the method comprising:
   spraying a cleaning solution from a location underneath the spin head to a bottom of the spin head, to clean the bottom of the spin head, the spin head being in a container having an internal wall; and
   supplying a rinse solution to a top of the spin head to perform cleaning on the top of the spin head and on the internal wall of the container,
   the rinse solution is supplied toward a location deviating from a central part of the spin head, and
   the spraying the cleaning solution including spraying the cleaning solution from a first cleaning nozzle into a first hole in the spin head to have the cleaning solution travel a first distance and concurrently spraying the cleaning solution from a second cleaning nozzle onto a lower plate of the spin head to have the cleaning solution travel a second distance, less than the first distance, while keeping the first cleaning nozzle a fixed distance from the second cleaning nozzle, wherein the first cleaning nozzle and the second cleaning nozzle are on a support arm at the fixed distance from each other, wherein the spraying the cleaning solution is performed simultaneously with the supplying the rinse solution, and the spin head changes a rotating direction while the rinse solution and the cleaning solution are supplied.

10. The method of claim 9, wherein the cleaning solution is at room temperature.

11. The method of claim 9, wherein the rinse solution is sprayed onto the spin head while the substrate processing apparatus is not processing the substrate.

12. The method of claim 9, wherein the rinse solution cleans the top of the spin head, a support pin included in the spin head, and a chuck pin included in the spin head.

13. The method of claim 9, wherein the cleaning solution is spattered onto the internal wall while the spin head is rotating in a clockwise direction or a counterclockwise direction.

14. A method of cleaning an apparatus configured to process a substrate supported on a spin head, the method comprising:

spraying a cleaning solution from a location underneath the spin head to a bottom of the spin head, the spin head placed in a container having an internal wall; and supplying a rinse solution to a top of the spin head while the substrate is not on the spin head, the rinse solution is supplied toward a location deviating from a central part of the spin head, wherein during the supplying the rinse solution, the spin head changes a rotating direction, the spraying the cleaning solution includes spraying the cleaning solution from a first cleaning nozzle into a first hole in the spin head to have the cleaning solution travel a first distance, and concurrently spraying the cleaning solution from a second cleaning nozzle onto a lower plate of the spin head to have the cleaning solution travel a second distance, less than the first distance, while keeping the first cleaning nozzle a fixed distance from the second cleaning nozzle, and the first cleaning nozzle and the second cleaning nozzle are on a support arm at the fixed distance from each other, wherein the spraying the cleaning solution is performed simultaneously with the supplying the rinse solution, and the spin head changes a rotating direction while the rinse solution and the cleaning solution are supplied.

15. The method of claim 14, wherein the cleaning solution is deionized water.

16. The method of claim 14, wherein the cleaning solution is at room temperature.

* * * * *